(12) United States Patent
Messerman et al.

(10) Patent No.: US 7,389,001 B2
(45) Date of Patent: Jun. 17, 2008

(54) REORGANIZING RECTANGULAR LAYOUT STRUCTURES FOR IMPROVED EXTRACTION

(75) Inventors: Dmitry Messerman, Haifa (IL); Michael Seltser, Haifa (IL)

(73) Assignee: Intel Corporation, Santa Clara, CA (US)

( * ) Notice: Subject to any disclaimer, the term of this patent is extended or adjusted under 35 U.S.C. 154(b) by 891 days.

(21) Appl. No.: 10/741,757

(22) Filed: Dec. 18, 2003

(65) Prior Publication Data

US 2005/0149889 A1 Jul. 7, 2005

(51) Int. Cl.
*G06K 9/36* (2006.01)
*G06F 17/50* (2006.01)
*G06F 9/45* (2006.01)

(52) U.S. Cl. .......................... 382/284; 382/282; 716/2; 716/8

(58) Field of Classification Search ................ 382/141, 382/144, 145, 293, 294, 113, 282, 284; 716/1–3, 716/8, 11, 12
See application file for complete search history.

(56) References Cited

U.S. PATENT DOCUMENTS

| 4,482,810 | A | * | 11/1984 | Cooke ........................ 716/21 |
| 5,062,054 | A | * | 10/1991 | Kawakami et al. ........... 716/11 |
| 2004/0228543 | A1 | * | 11/2004 | Anderson et al. ........... 382/276 |
| 2005/0044520 | A1 | * | 2/2005 | Vuong et al. ................. 716/12 |

* cited by examiner

*Primary Examiner*—Colin LaRose
(74) *Attorney, Agent, or Firm*—Erik R. Nordstrom

(57) ABSTRACT

Scanning a layer of a layout in a first direction and selecting a first rectangle in a scan order, scanning the layer of the layout in a second direction orthogonal to the first direction to find a second rectangle that intersects the first rectangle, and if the second rectangle is found, performing a union of the first and second rectangles to generate a set of non-intersecting rectangles equivalent to the first and second rectangle.

16 Claims, 4 Drawing Sheets

REORGANIZING RECTANGULAR LAYOUT STRUCTURES FOR IMPROVED EXTRACTION

BACKGROUND

In a typical integrated circuit (IC) computer-assisted design (CAD) process, a layout version of the design may be drawn or generated. As is well known in the art, the layout is often separated into layers corresponding to the different layers used in manufacturing and further organized into levels of hierarchy, corresponding, for instance, to levels of abstraction in the architectural version of the design. The layout version of the design generally consists of polygons restricted in placement and dimension by specific design rules. Most polygons in the layout represent a component of some structure to be implemented on the layer associated with the polygon. In a typical example, an n-p-n transistor in a CMOS design may be represented by two rectangles representing n-type diffusions in a p substrate, each implementing a source/drain of the transistor, and a rectangle representing the polysilicon gate.

One step in the analysis of a design in the layout version may require physical properties of the final manufactured circuit to be deduced from the layout version by an extraction CAD tool. In one instance, polygons representing conductive portions of the IC may be analyzed with respect to their geometries to construct a resistor network corresponding to the circuit the polygons represent, a process known in the art as resistance extraction. However, because polygons that form a circuit on a layer of the design may be drawn at different times in different layers of the hierarchy, some pre-processing of the polygons must be performed in order to eliminate overlaps and optimize the polygons for extraction by reorganizing them into a geometrically equivalent set of polygons that are better suited for extraction purposes.

DETAILED DESCRIPTION

Overview

Figure 1:
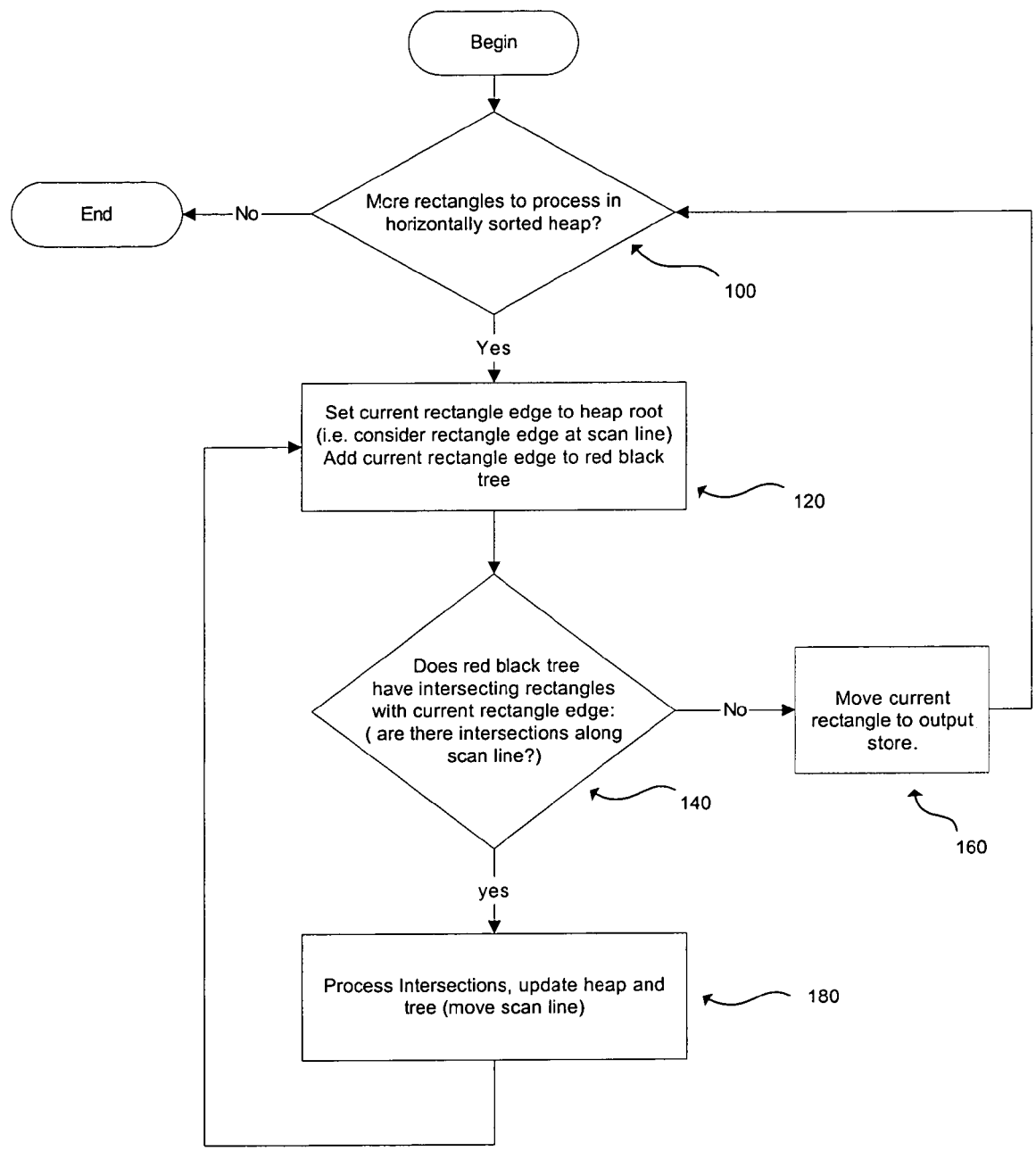
FIG. 1 depicts a flowchart of processing in one embodiment.

In one embodiment, a layout analysis tool preparing layout for a subsequent step, such as resistance extraction, may operate on an input layout in accordance with the high level flowchart of FIG. 1. The input generally includes overlapping rectangles such as those shown in FIG. 2a. A preliminary cleanup step of such a tool then removes overlaps and transforms the input layout including overlapping rectangles into an equivalent layout that has identical external geometries to the rectangles of the input but is represented in terms of non-overlapping rectangles, by fracturing some rectangles, such as exemplified in FIG. 2b.

The tool then operates on the fractured output of the first cleanup step to improve the quality of the output for resistance extraction. This is done in part by refracturing and merging rectangles in the output of the cleanup step as depicted in the exemplary cases in FIG. 3, where pairs of rectangles shown in configurations 3a, 3b, 3c and 3d are respectively transformed into the new pairs 3e, 3f, 3g and 3h as shown.

This refractured and merged layout rectangle data may now be used for effective resistance extraction.

Exemplary pseudo-code depicting the above overview is provided in Table 1.

TABLE 1

Begin
    Identify All Rectangles in Layout Database on given Layer
    Clean up Rectangles to Remove Overlaps
    Refracture and Merge Non-overlapped output layout
    Resistance Extraction on layer
End

ALGORITHMS AND EXAMPLES

It is well known in the art that for a layout that is composed only of polygons that have Manhattan geometries (that is, internal angles are 90 degrees or 270 degrees), it is possible to convert the layout into an equivalent layout composed entirely of rectangles. Thus, the input to the processing outlined above may be assumed to be composed entirely of rectangles without loss of generality. Thus the claimed subject matter may apply to any layout composed of Manhattan geometries after a suitable transformation as is well known to the artisan.

Identification of all rectangles on a layer in a layout database is well known in the art and will not be discussed further. Once rectangles are identified, they are provided in some appropriate format to the clean up phase of the processing.

TABLE 2

Input: A - a set of rectangles represented by 4 points, each point
having fields including its coordinates (x, y), a pointer to its parent
rectangle, its hierarchical level, and flags that may be conceptualized
as the enumerations (Upper/Bottom), and (Left/Right).
Output: C - a heap, whose root is a node with the minimal key, storing
output rectangles.
Intermediate: T - a red-black tree, which contains rectangle vertices
Definition: an active rectangle is a rectangle whose vertices are
present in T.
Algorithm
1. Build a heap H whose root is a node with the minimal key from only
Bottom points of A according to their x-coordinates. Each object of H
has key x, fields y and Left/Right, and a pointer to the corresponding
rectangle.
Break ties as follows:
a) Right point precedes Left point with the same x-coordinate
b) Compare y-coordinates. The order is increasing.
c) Compare pointers. The order is increasing.
2. Repeat
    a) Extract $x_{min}$ - minimum from H. Let us call corresponding point
    M = $(x_{min}, y_M)$.
    b) If M is Left point Then
    Insert $y_M$ and y-coordinate of the corresponding upper point into
    red-black tree T. Break ties as follows. Upper point is
    less than Bottom one if hierarchical levels of their rectangles
    are equal and more otherwise. If both of points have the same
    type then point with smaller x-coordinate is less. If they are TABLE 2-continued

```
equal then increasing order of pointers to their rectangles will
decide.
Do
    N = Predecessor( M )      //biggest element in T which
    is smaller than M
    If N is Bottom point Then
        SolveIntersection( N, M )    // N's and M's
        rectangles intersect
    Else
        N = Successor( M )    //least element in T which is
        bigger than M
    If N is not M's upper point Then
        SolveIntersection( N, M ) . // N's and M's rectangles
        intersect
    Else break
While ( 1 )
    Else Extract Left point of M's rectangle out of T. Insert
M's rectangle into C.
Until H is empty.
```

Figure 2A:
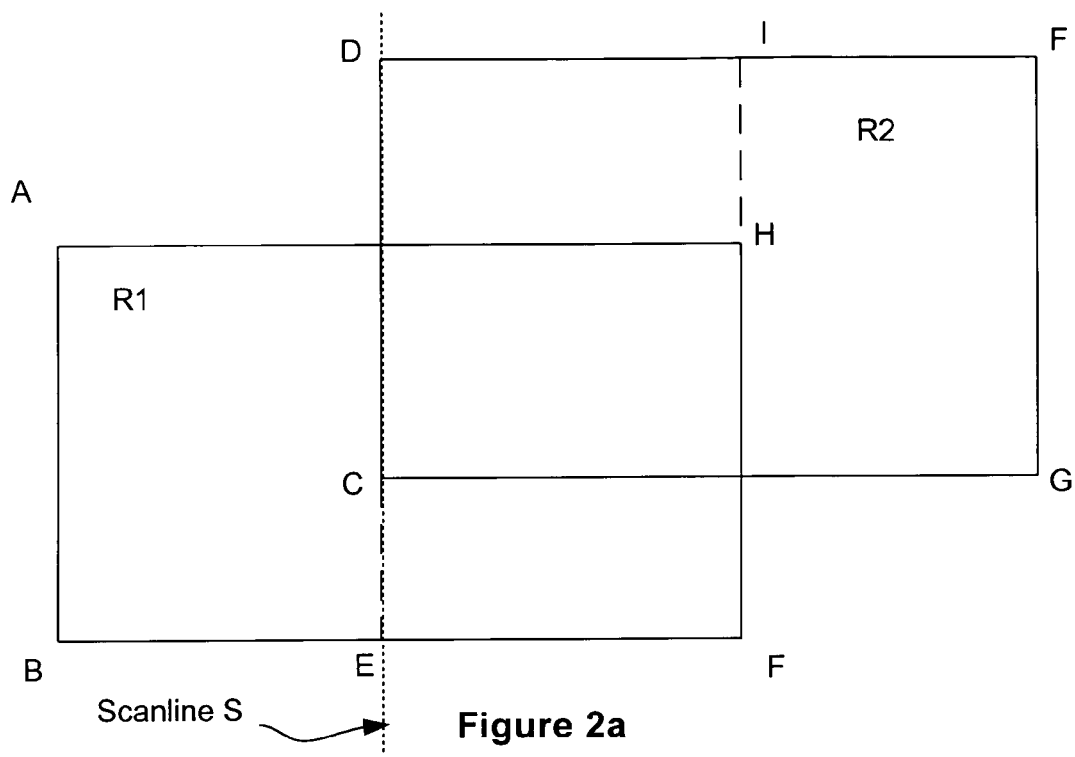
FIG. 2a depicts a possible pair of overlapped rectangles of a layout
Figure 2B:
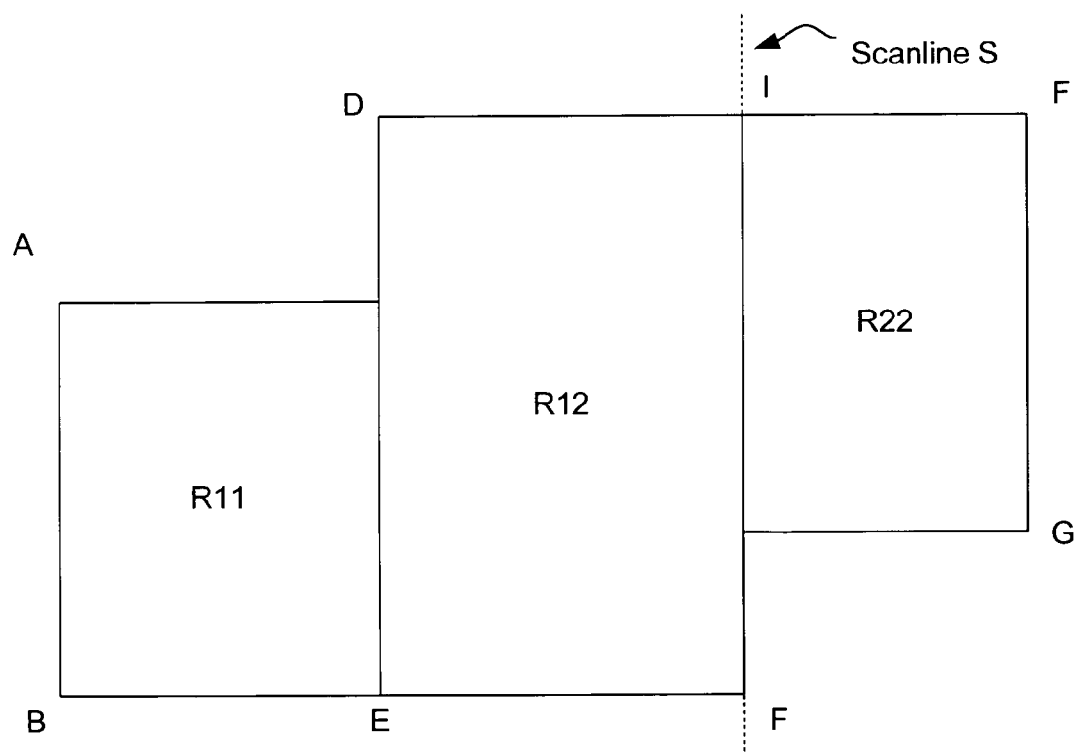
FIG. 2b depicts a set of rectangles created from the rectangles of FIG. 1a after the operation of a tool in one embodiment.

A flowchart depicting high level processing of the clean up phase from the in one embodiment is depicted in FIG. 1 The processing depends on a heap and a red-black tree, which are both well known in the art. Therefore, these data structures and the corresponding access algorithms are not detailed here. As depicted in the flowchart, processing in the embodiment uses a heap that sorts representations of rectangles horizontally. Processing continues as long as there are rectangles remaining to process, 100. In the next phase, the processing considers rectangles in turn from the heap, effectively performing a horizontal scan across the layout, considering vertical edges of rectangles as they occur in horizontal order. The scan may be visualized as the progress of a vertical scan line across the layout, as depicted in FIGS. 2*a* and 2*b*. Points of the rectangle corresponding to the current edge at the scan line are the root of the heap. As is known in the art, the "top" or root element of the heap is always the lowest according to heap ordering. The points from the heap are inserted in vertically sorted order into a red-black tree 120. The tree allows processing to determine intersections between the current rectangle and others at the same vertical position as the current scan line. If intersections are found 140, they are processed and new points that are created at the scan line are added to the tree; new points created on the unprocessed side of the scan line are added to the heap, 180, and processing at the scan line loops back to 120. Otherwise, the current rectangle is termed "clean" because it has no overlaps with other rectangles, and it may be output to a store, 160.

A more detailed version of the processing in the flowchart is provided as the pseudo code depicting a clean up phase of the processing in the embodiment is in Table 2 above. With reference to the pseudo code, x and y are arbitrarily chosen 2-dimensional orthogonal coordinate variables in the standard manner where x is nominated as the "horizontal" coordinate and y is the "vertical" coordinate. Thus references to x and y are used interchangeably with references to horizontal and vertical coordinates or directions respectively.

Step 1 in the algorithm of Table 2 is a horizontal scan of the rectangles in the input to the processing, and orders the bottom points of the rectangles into a first data structure of points, a heap, sorted by the criteria listed in step 1. The scan uses a horizontal heap sort of the bottom points of the rectangles based on their relative horizontal positions in the layout, whether the point is on the right or left edge of the rectangle, (i.e. the right or left handedness of the point), and other factors to break ties between points that are from different rectangles but are located at the same position, as may occur when two rectangles in the layout share a common edge.

Step 2 in the algorithm extracts the root element i.e. the lowest ordered bottom point of a rectangle in the heap and inserts it into a red-black tree. This tree is a representation of all the rectangles intersected by the current position of the scan line. The tree represents all the rectangles intersected by the scan line, ordered by the relative vertical positions of their vertical edges; that is, the values of the vertical coordinates of the points inserted, among other factors. This is detailed in the pseudo code in Table 2. After insertion of the point and its corresponding upper point, the tree provides a quick way to check for rectangles that may intersect the rectangle corresponding to the inserted point. The code inspects the points immediately neighboring the inserted point in the ordering defined by the tree. The checks described in table 2 then indicate whether the newly inserted pair of points belongs to a rectangle that intersects any already in the tree. Specifically, the algorithm checks the newly inserted points against its neighbors on a pair by pair basis, creating new rectangles as necessary if intersections are detected. After both vertical edges of a rectangle have been added to the tree and processed for intersections, any resulting new rectangles are entered into the heap and tree as appropriate. If no new rectangles are generated, the rectangle may be output to a store of non-intersecting rectangles. At an intuitive level, the changes to the heap and the tree after each vertical edge is processed represents the movement of the horizontal scan line across the layout. It may be noted that layout on the left of the scan line is cleaned up in the sense that there are no overlapping rectangles; while the layout to the right of the scan line may still have overlapping rectangles.

TABLE 3

```
SolveIntersection( R1, R2 )
Globals
Heap H; Tree T; Scanline S;
Definition
P: polygon defined by the outer boundary of R1 union R2
    Create a new rectangle R11 from the part of P that resides on the
    left of the scan line and output it
    If R1 and R2 have the same hierarchical levels then
        create a new rectangle R12, which will take the place of R1 and
        R2 in T, as one more rectangle, intersecting S. Left points of
        R12 will come into T instead of left points of R1 and R2.
    Else
        abutting rectangles are generated in place of R12. Left points
        of each such new rectangle will be inserted into T
    Endif
    Create a new rectangle R22 from the part of P that resides on the
    right of R12 side. Insert its bottom nodes into H.
```

Table 3 above provides additional detail related to the SolveIntersection function used in the pseudocode of Table 2 for this embodiment. In SolveIntersection, the scanline is at the first edge in scan order of a rectangle R2 while the current rectangle R1 has not yet been processed. Thus R1 and R2 intersect. This is depicted in FIG. 2*a*. As may be seen from the pseudocode, the function then merges the overlapped portions of rectangles R1 and R2 and moves the scan line to the right edge of R1 and outputs the clean rectangle to the left of the new scan line. This is depicted in FIG. 2*b*.

It should be noted that the operation of the pseudo code above is unrestricted by hierarchy. Hierarchy may be used to break ties in ordering but rectangles from two or more hierarchical layers or all hierarchical levels on which polygons from a layer are found may be processed by the algorithm above. In each case, clean non-overlapped layout is the result.

Furthermore, many other embodiments of this algorithm are possible. For one example, an algorithm may process rectangles from two or more layers when the two or more layers are logically distinct in the database but physically implemented by the same layer in manufacturing. For another example, the red-black tree used to sort the rectangles in a vertical direction may be replaced by other binary search trees or other balanced trees as are known in the art. Many other variations in accordance with the claimed subject matter are possible.

The pseudo code above may be further explained with reference to a graphical example. FIG. 2 represents one possible input set to the above algorithm. FIG. 2a represents the starting state, overlapped rectangles R1 or points BFAH and R2 or points CGDF. FIG. 2b represents the output, non-overlapped rectangles R11, R12, and R22. The processing of the rectangle of FIG. 2a proceeds as follows, referring to the figure for the locations of points A-H and rectangles R1, R11, R2, R12, and R22:

Initially, heap=(B, C, F, G), and the tree is empty. Heap top=B. The code then extracts B and inserts it into the tree along with A.

Heap=(C, F, G), tree=(B, A). B is the least element of the tree, and B's successor is A. Thus, there are no overlaps. New Heap top=C. The algorithm now extracts C and inserts it into the tree along with D.

Heap=(F, G), tree=(B, C, A, D). C's predecessor is bottom point B, so their rectangles (R1 and R2) intersect. The processing in SolveIntersection then transforms these rectangles into new rectangles R11, R12, R22. Rectangle R11 is output, B, A, C are deleted from of the tree, new point E appears and enters the tree as the left bottom point of rectangle R12. F becomes the right bottom point of rectangle R12, H appears as the left bottom point of rectangle R22 and joins the heap, I appears as left top point of rectangle 3, G becomes right point of rectangle R22.

Heap=(F, H, G). Next the code extracts F from the heap.

Heap=(H, G), tree=(E, D). F is the top right point of rectangle R12 and therefore its left points E and D are deleted out of the tree, rectangle R12 is output, heap top=H. The algorithm extracts H and inserts it into the tree along with I.

Heap=(G), tree=(H, I). H is the least element of the tree and H's successor is I, thus, there are no overlaps. Heap top=G. The code extracts G. Heap is empty, tree=(H, I). G is right point of rectangle R22 and its left points H and I are deleted out of the tree, rectangle R22 is output, and the heap is empty.

From the pseudo code above, it may be observed that the definition of intersection used in this algorithm is as follows, for rectangles R1 in the tree and R2 extracted from the heap: Rectangles R1 and R2 intersect if the predecessor of R2's left bottom point in the tree is the left bottom point of R1, or if the successor of R2's left bottom point in the tree is not R2's left top point. As will be clear to the artisan from this definition, the above algorithm is therefore also a merging algorithm, because if R1 and R2 are a pair of rectangles with a common side, they will be considered intersecting rectangles, and therefore the output will be a single rectangle that is the result of eliminating the common side.

After the completion of processing, the non-overlapping rectangles output may be further processed by refracturing and then reprocessing the rectangles using a similar algorithm to the above cleanup algorithm. This process enables better resistance extraction in this embodiment. A set of specific rules is used to select rectangles for refracturing to improve extractability. The rules are illustrated by examples depicted in FIG. 3. These rules are as follows:

For each abutting group of rectangles, the processing first identifies and removes long edge interactions. Thus, the processing would convert the two rectangles A and B depicted in FIG. 3a into the three rectangles C, D and E depicted in FIG. 3e.

Figure 3A:
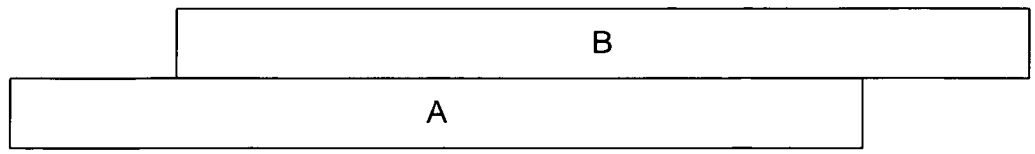
FIGS. 3a-d each depict a possible pair of non overlapping rectangles of a layout.
Figure 3E:
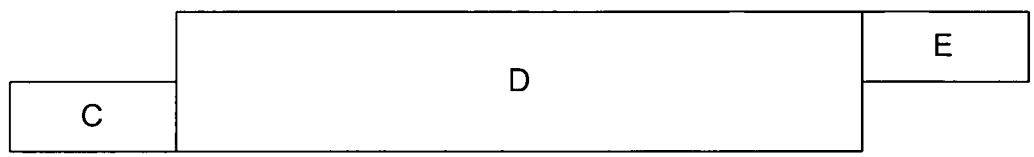
FIGS. 3e-h each depict a set of rectangles created from the rectangles of FIGS. 3a-d respectively after the operation of a tool in one embodiment.
Figure 3B:
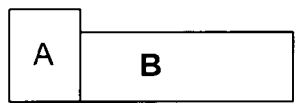
Figure 3F:
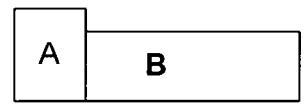
Figure 3C:
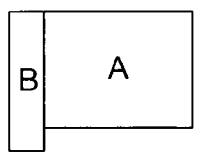
Figure 3G:
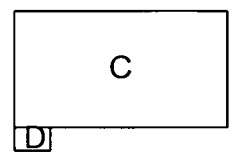
Figure 3D:
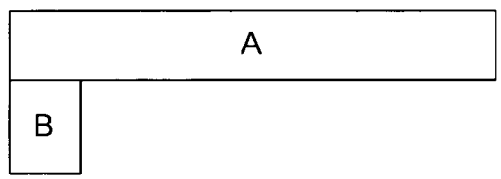
Figure 3H:
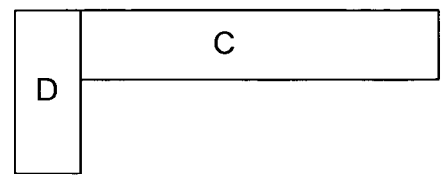

Next, the processing identifies and minimizes tiny shapes. A tiny shape is any rectangle that has one or more dimensions that fall below a minimum value defined by the design rules for the layout. FIGS. 3b and 3c depict two possibilities. In FIG. 3b, the small rectangle A is not a tiny shape; the processing leaves A and B unchanged as in 3f. In FIG. 3c, the rectangle B is a tiny shape; by fracturing and merging A and B, a new pair of rectangles C and D is obtained that minimizes the aspect ratio of the tiny shape C as shown in FIG. 3g Finally, for all other abutting rectangles, the processing minimizes the maximum aspect ratio of the rectangles formed by fracturing, as shown in FIGS. 3d and 3h, where the pair of rectangles A and B shown in FIG. 3d is transformed into the pair shown in FIG. 3h.

It should be noted that embodiments such as those described above are not restricted to preparing layout for resistance extraction. Some embodiments may also prepare layout for other forms of analysis where non-overlapped rectangular polygonal input is useful. Furthermore, the application of the cleanup, re-fracture and merge algorithms of the embodiments described above for resistance extraction is not restricted only to this application. For example, other electrical properties of layout that behave analogous to resistance may be analyzed by analogous embodiments.

Figure 4:
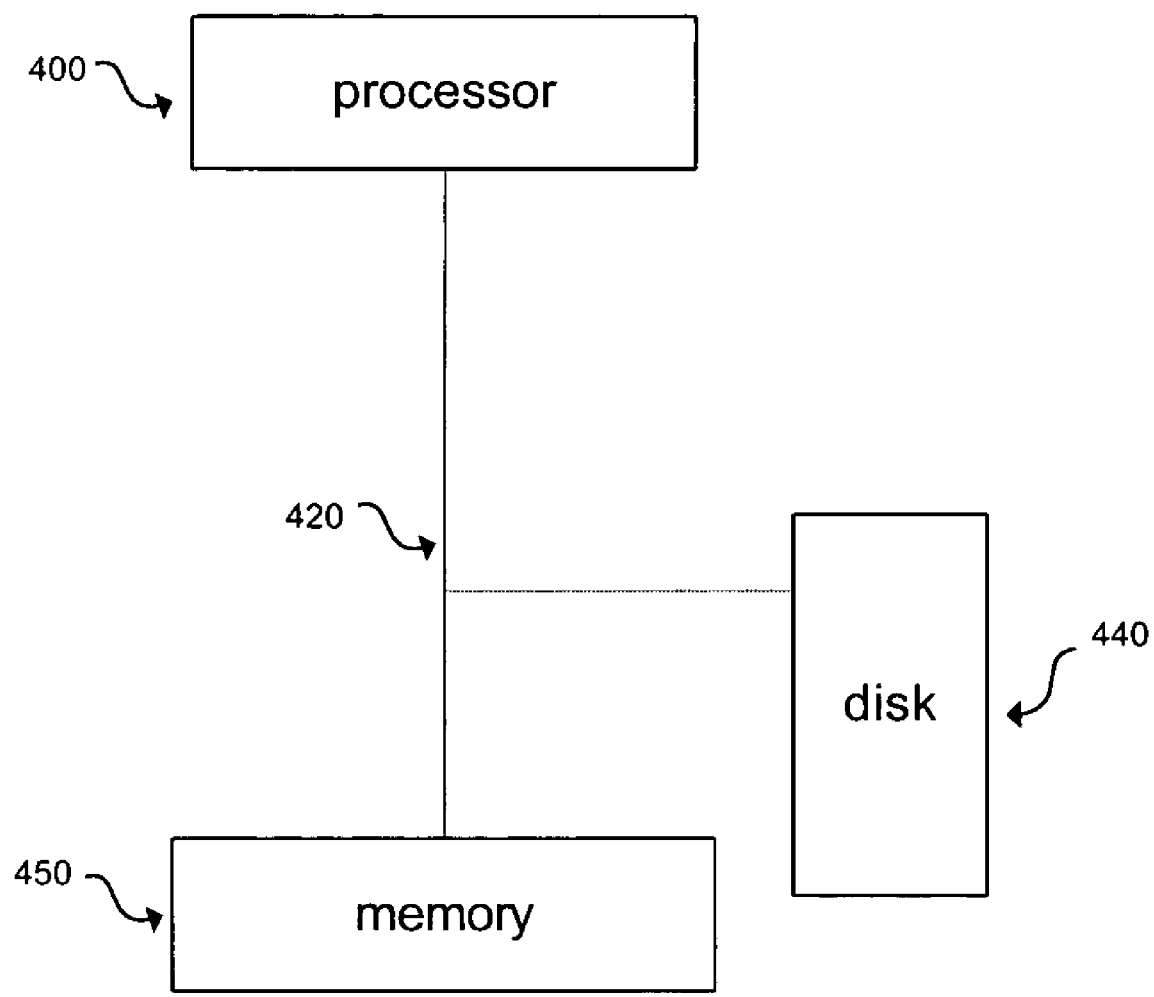
FIG. 4 depicts one embodiment of a processor based system.

In general, a system embodying the claimed subject matter may be implemented by a processor based system such as that depicted in FIG. 4. Such a system is a processor based system including a processor 400, a memory 450 to store data and programs executable by the processor, and a storage unit such as a disk system 440 all interconnected by a bus system 420. A program embodying the algorithms described may be stored on the disk system and loaded into memory via the bus system and executed by the processor on layout data which may also be stored on the disk system and optionally in memory. A widely available system such as an Intel® Xeon™ processor based server running the Linux operating system is one exemplary embodiment of a processor based system as depicted in the figure that may be used to execute a layout analysis tool in accordance with the claimed subject matter.

While certain exemplary embodiments of the invention have been described above and shown in the accompanying drawings, it is to be understood that such embodiments are merely illustrative of and not restrictive on the broad aspects of various embodiments of the invention, and that these embodiments not be limited to the specific constructions and arrangements shown and described, since various other modifications are possible. It is possible to implement the embodiments of the invention or some of their features in hardware, programmable devices, firmware, software or a combination thereof.

Embodiments in accordance with the claimed subject matter may be provided as a computer program product that may include a machine-readable medium having stored thereon data which when accessed by a machine may cause the machine to perform a process according to the claimed subject matter. The machine-readable medium may include, but is not limited to, floppy diskettes, optical disks, DVD-ROM disks, DVD-RAM disks, DVD-RW disks, DVD+RW disks, CD-R disks, CD-RW disks, CD-ROM disks, and magneto-optical disks, ROMs, RAMs, EPROMs, EEPROMs, magnet or optical cards, flash memory, or other type of media/machine-readable medium suitable for storing electronic instructions. Moreover, embodiments may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form but steps can be added to or deleted from any of the methods and information can be added or subtracted from any of the described messages without departing from the basic scope of the claimed subject matter. It will be apparent to those skilled in the art that many further modifications and adaptations can be made. The particular embodiments are not provided to limit the invention but to illustrate it. The scope of the claimed subject matter is not to be determined by the specific examples provided above but only by the claims below.

What is claimed is:

1. A method comprising:
    scanning a layer of a layout across one or more hierarchical levels of the layout in a first direction and selecting a first rectangle in a scan order;
    scanning the layer of the layout in a second direction orthogonal to the first direction to find a second rectangle that intersects the first rectangle; and
    if the second rectangle is found, performing a union of the first and second rectangles to generate a set of non-intersecting rectangles equivalent to the first and second rectangle;
    storing the first rectangle in an output store if no rectangle that intersects the first rectangle is found;
    wherein scanning a layer of a layout in a first direction and selecting a first rectangle in a scan order further comprises storing points of rectangles on the layer of the layout in a first data structure of points in an order based at least in part on the relative horizontal positions of the rectangles formed by the points in the layout; and
    extracting a point of a first rectangle from the first data structure, the point being the least in order in the first data structure; and
        wherein scanning the layer of the layout in a second direction orthogonal to the first direction for a second rectangle that intersects the first rectangle further comprises:
    reinserting at least the vertical coordinate of the extracted point from the first rectangle into a second data structure, organized in an order based at least in part on the relative vertical positions of the rectangles formed by the points in the layout; and
    examining each rectangle vertically adjacent to the extracted rectangle in a pair wise fashion with reference to the first rectangle by traversing the second data structure.

2. The method of claim 1 further comprising updating the first and second data structure based on the coordinates of the set of non-intersecting rectangles.

3. The method of claim 1 wherein storing points of rectangles on a layer of a layout in a first data structure of points, in an order based at least in part on the relative horizontal positions of the rectangles formed by the points in the layout further comprises storing the two bottom points of each rectangle in the layer of the layout in a heap organized by an ordering based at least in part on the horizontal coordinate of each point and by the left or right handedness of each point.

4. The method of claim 1 wherein inserting at least the vertical coordinate of the extracted point from the first rectangle into a second data structure of points, organized in an order based at least in part on the relative vertical positions of the rectangles formed by the points in the layout further comprises storing the vertical coordinate of each of the extracted point, and the upper point in the first rectangle corresponding to the extracted point, in a search tree organized by an ordering based at least in part on the vertical coordinate of each point represented in the search tree.

5. The method of claim 4 wherein the search tree is implemented as a red-black tree.

6. The method of claim 1 further comprising:
    identifying a rectangle in the output store of rectangles based on properties of one or more of the identified rectangle and
    the identified rectangle and one or more of its neighbors (neighbor group); and
    transforming at least one of the rectangles in the neighbor group.

7. The method of claim 6 wherein identifying a rectangle further comprises:
    identifying a rectangle that satisfies one or more of the following:
    the rectangle has a dimension that falls outside a range of values; or
    the rectangle abuts at least one other rectangle.

8. The method of claim 7 wherein transforming least one of the rectangles in the neighbor group further comprises one or more of:
    fracturing a first rectangle in the abutting group into two rectangles by adding an edge parallel to the shortest side of the first rectangle; and
    merging a pair of rectangles in the abutting group with a common side into a new rectangle;
    wherein the one or more transformations result in one or more of reducing the maximum of the aspect ratios of all the rectangles in the abutting group; and changing a dimension of a rectangle that falls outside the range of values to a dimension that falls inside the range of values.

9. A machine readable medium having stored thereon data which when accessed by a machine causes the machine to perform a method, the method comprising:
    scanning a layer across one or more hierarchical levels of a layout in a first direction and selecting a first rectangle in a scan order;
    scanning the layer of the layout in a second direction orthogonal to the first direction to find a second rectangle that intersects the first rectangle; and
    if the second rectangle is found, performing a union of the first and second rectangles to generate a set of non-intersecting rectangles equivalent to the first and second rectangle; and
    storing the first rectangle in an output store if no rectangle that intersects the first rectangle is found;
        wherein scanning a layer of a layout in a first direction and selecting a first rectangle in a scan order further comprises:
    storing points of rectangles on the layer of the layout in a first data structure of points in an order based at least in part on the relative horizontal positions of the rectangles formed by the points in the layout; and extracting a point of a first rectangle from the first data structure, the point being the least in order in the first data structure;
  wherein scanning the layer of the layout in a second direction orthogonal to the first direction for a second rectangle that intersects the first rectangle further comprises:
reinserting at least the vertical coordinate of the extracted point from the first rectangle into a second data structure, organized in an order based at least in part on the relative vertical positions of the rectangles formed by the points in the layout; and
examining each rectangle vertically adjacent to the extracted rectangle in a pair wise fashion with reference to the first rectangle by traversing the second data structure.

10. The machine readable medium of claim 9 wherein the method further comprises updating the first and second data structure based on the coordinates of the set of non-intersecting rectangles.

11. The machine readable medium of claim 9 wherein storing points of rectangles on a layer of a layout in a first data structure of points, in an order based at least in part on the relative horizontal positions of the rectangles formed by the points in the layout further comprises storing the two bottom points of each rectangle in the layer of the layout in a heap organized by an ordering based at least in part on the horizontal coordinate of each point and by the left or right handedness of each point.

12. The machine readable medium of claim 9 wherein inserting at least the vertical coordinate of the extracted point from the first rectangle into a second data structure of points, organized in an order based at least in part on the relative vertical positions of the rectangles formed by the points in the layout further comprises storing the vertical coordinate of each of the extracted point, and the upper point in the first rectangle corresponding to the extracted point, in a search tree organized by an ordering based at least in part on the vertical coordinate of each point represented in the search tree.

13. The machine readable medium of claim 12 wherein the search tree is implemented as a red-black tree.

14. The machine readable medium of claim 9 wherein the method further comprises:
  identifying a rectangle in the output store of rectangles based on properties of one or more of the identified rectangle and
  the identified rectangle and one or more of its neighbors (neighbor group); and
  transforming at least one of the rectangles in the neighbor group.

15. The machine readable medium of claim 14 wherein identifying a rectangle further comprises:
  identifying a rectangle that satisfies one or more of the following:
    the rectangle has a dimension that falls outside a range of values; or
    the rectangle abuts at least one other rectangle.

16. The machine readable medium of claim 15 wherein transforming least one of the rectangles in the neighbor group further comprises one or more of:
  fracturing a first rectangle in the abutting group into two rectangles by adding an edge parallel to the shortest side of the first rectangle; and
  merging a pair of rectangles in the abutting group with a common side into a new rectangle;
  wherein the one or more transformations result in one or more of
    reducing the maximum of the aspect ratios of all the rectangles in the abutting group; and
    changing a dimension of a rectangle that falls outside the range of values to a dimension that falls inside the range of values.

* * * * *